(12) United States Patent
Sayama et al.

(10) Patent No.: US 8,586,475 B2
(45) Date of Patent: Nov. 19, 2013

(54) SEMICONDUCTOR DEVICE INCLUDING GATE ELECTRODE FOR APPLYING TENSILE STRESS TO SILICON SUBSTRATE, AND METHOD OF MANUFACTURING THE SAME

(71) Applicant: Renesas Electronics Corporation, Kodaira (JP)

(72) Inventors: Hirokazu Sayama, Tokyo (JP); Kazunobu Ohta, Tokyo (JP); Hidekazu Oda, Tokyo (JP); Kouhei Sugihara, Tokyo (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 0 days.

(21) Appl. No.: 13/743,012

(22) Filed: Jan. 16, 2013

(65) Prior Publication Data

US 2013/0130457 A1 May 23, 2013

Related U.S. Application Data

(60) Continuation of application No. 13/103,558, filed on May 9, 2011, now Pat. No. 8,372,747, which is a continuation of application No. 12/323,507, filed on Nov. 26, 2008, now Pat. No. 7,960,281, which is a continuation of application No. 11/671,216, filed on Feb. 5, 2007, now Pat. No. 7,470,618, which is a continuation of application No. 11/127,093, filed on May 12, 2005, now Pat. No. 7,183,204, which is a division of application No. 10/620,379, filed on Jul. 17, 2003, now Pat. No. 6,906,393.

(30) Foreign Application Priority Data

Nov. 20, 2002 (JP) .................................. 2002-336669

(51) Int. Cl.
*H01L 21/44* (2006.01)

(52) U.S. Cl.
USPC .... 438/663; 438/197; 438/288; 257/E21.004; 257/E21.058; 257/E21.19; 257/E21.51; 257/E21.278; 257/E21.632; 257/E21.435

(58) Field of Classification Search
USPC ......... 438/197, 663, 287, 149, 517, 553, 723, 438/743, 756; 257/E21.004, E21.058, 257/E21.19, E21.51, E21.278, E21.632, 257/E21.435

See application file for complete search history.

(56) References Cited

U.S. PATENT DOCUMENTS 5,155,571 A 10/1992 Wang et al.
5,815,223 A 9/1998 Watanabe et al.

(Continued)

FOREIGN PATENT DOCUMENTS

| JP | 4-99037 | 3/1992 |
| JP | 05-136075 | 6/1993 |
| JP | 9-199719 | 7/1997 |
| JP | 11-031665 | 2/1999 |

(Continued)

OTHER PUBLICATIONS

J. Welser, et al., "NMOS and PMOS Transistors Fabricated in Strained Silicon/Relaxed Silicon-Germanium Structures", Proc. of International Electron Device Meeting 1992, IEDM 92, pp. 1000-1002.

(Continued)

*Primary Examiner* — David Nhu
(74) *Attorney, Agent, or Firm* — Oblon, Spivak, McClelland, Maier & Neustadt, L.L.P.

(57) ABSTRACT

A gate insulating film and a gate electrode of non-single crystalline silicon for forming an nMOS transistor are provided on a silicon substrate. Using the gate electrode as a mask, n-type dopants having a relatively large mass number (70 or more) such as As ions or Sb ions are implanted, to form a source/drain region of the nMOS transistor, whereby the gate electrode is amorphized. Subsequently, a silicon oxide film is provided to cover the gate electrode, at a temperature which is less than the one at which recrystallization of the gate electrode occurs. Thereafter, thermal processing is performed at a temperature of about 1000° C., whereby high compressive residual stress is exerted on the gate electrode, and high tensile stress is applied to a channel region under the gate electrode. As a result, carrier mobility of the nMOS transistor is enhanced.

10 Claims, 14 Drawing Sheets

(56) References Cited

U.S. PATENT DOCUMENTS

| | | |
|---|---|---|
| 5,998,807 A | 12/1999 | Lustig et al. |
| 6,251,778 B1 | 6/2001 | Fang et al. |
| 6,342,421 B1 | 1/2002 | Mitani et al. |
| 6,495,418 B2 | 12/2002 | Shimizu et al. |
| 6,682,965 B1 | 1/2004 | Noguchi et al. |
| 6,750,486 B2 | 6/2004 | Sugawara et al. |
| 6,906,393 B2 | 6/2005 | Sayama et al. |
| 7,132,317 B2 | 11/2006 | Arao |
| 7,183,204 B2 | 2/2007 | Sayama et al. |
| 7,470,618 B2 | 12/2008 | Sayama et al. |
| 7,960,281 B2 | 6/2011 | Sayama et al. |
| 7,994,538 B2 | 8/2011 | Kim |
| 8,372,747 B2 * | 2/2013 | Sayama et al. ............ 438/663 |

FOREIGN PATENT DOCUMENTS

| | | |
|---|---|---|
| JP | 11-204492 | 7/1999 |
| JP | 2000-058822 | 2/2000 |
| JP | 2001-257273 | 9/2001 |
| JP | 2001-284558 | 10/2001 |
| JP | 2002-93921 | 3/2002 |
| JP | 2002-329868 | 11/2002 |

OTHER PUBLICATIONS

T. Mizuno, et al., "High Performance Strained-Si p-MOSFETs on SiGe-On-Insulator Substrates Fabricated by SIMOX Technology", Proc. of International Electron Device Meeting 1999, IEEE, pp. 934-936.

* cited by examiner

F I G. 11
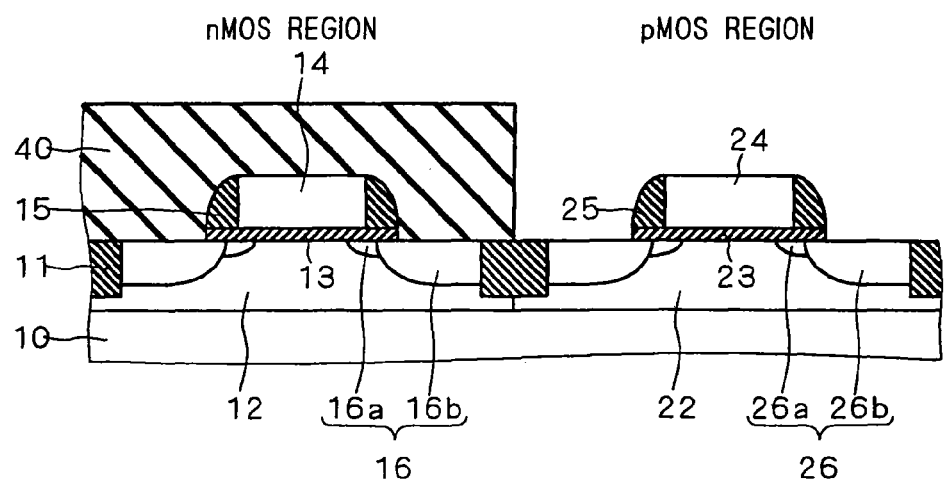
F I G. 12
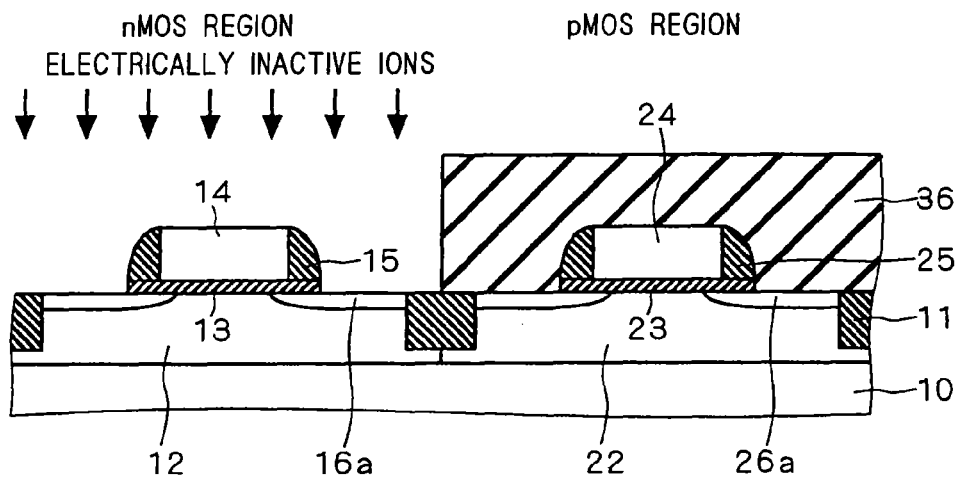

SEMICONDUCTOR DEVICE INCLUDING GATE ELECTRODE FOR APPLYING TENSILE STRESS TO SILICON SUBSTRATE, AND METHOD OF MANUFACTURING THE SAME

This application is a continuation of and claims the benefit of priority under 35 U.S.C. §120 from U.S. Ser. No. 13/103,558 filed May 9, 2011 (now U.S. Pat. No. 8,372,747 issued Feb. 12, 2013), which is a continuation of U.S. Ser. No. 12/323,507 filed Nov. 26, 2008 (now U.S. Pat. No. 7,960,281 issued Jun. 14, 2011), which is a continuation of U.S. Pat. No. 7,470,618 issued Dec. 30, 2008, which is a continuation of U.S. Pat. No. 7,183,204 issued Feb. 27, 2007, which is a division of U.S. Pat. No. 6,906,393 issued Jun. 14, 2005, and claims the benefit of priority under 35 U.S.C. §119 from Japanese Patent Application No. 2002-336669 filed Nov. 20, 2002, the entire contents of each of which are incorporated herein by reference.

BACKGROUND OF THE INVENTION

1. Field of the Invention

The present invention relates to a semiconductor including a MOS (metal oxide semiconductor) field effect transistor, and method of manufacturing the same.

2. Description of the Related Art

For a MOS field effect transistor (MOS transistor), increase in drain current as a driving current is one of the ways of improving characteristic of this MOS transistor. Carrier mobility is one of the determinants of drain current. The carrier mobility is virtually controlled by a substrate material, and therefore, it can hardly be changed. On the other hand, it has been found that scattering probability and effective mass of carriers are altered by the change in lattice spacing of substrate atoms, allowing change of carrier mobility.

SiGe has wider lattice spacing than Si. In a substrate including SiGe and Si stacked thereon, the lattice spacing of the upper-layer Si is widened accordingly. The substrate including the widened lattice spacing of silicon is called as a "strained silicon substrate". The strained silicon substrate has a higher carrier mobility than a conventional silicon substrate, providing increase in drain current of a MOS transistor formed thereon. An example of such conventional art is given in the non-patent document 1, Weiser et al., "NMOS and PMOS Transistors Fabricated in Strained Silicon/Relaxed Silicon-Germanium Structures", pp. 1000-1002, International Electron Device Meeting 1992, and in the non-patent document 2, T. Mizuno et al., "High Performance Strained-Si p-MOSFETs on SiGe-on-Insulator Substrates Fabricated by SIMOX Technology", pp. 934-936, International Electron Device Meeting 1999.

On the other hand, the strained silicon substrate encounters the problems as follows which result from use of SiGe as a substrate material: crystal defect and deterioration in surface roughness caused by SiGe, rise in substrate temperature due to low heat conductivity of SiGe, increase in short-channel effect in a p-channel MOS transistor covering band discontinuity at an interface between SiGe and Si, or the like. Other problems involved therein associated with process steps include inapplicability to STI (shallow trench isolation) technique, or insufficient activation annealing, for example. In view of this, for actually using the strained silicon substrate in LSIs, there remain a lot of problems to be solved.

By way of example, Japanese Patent Application Laid-Open No. 2002-93921 (pp. 3-6 and FIGS. 1-19), hereinafter referred to as the patent document 1, discloses that the lattice spacing of silicon of a MOS transistor may be varied by applying stress to a silicon substrate.

By way of example, tensile stress exerted on a channel region causes increase in driving current of an n-channel MOS transistor (NMOS transistor), while causing reduction in driving current of a p-channel MOS transistor (PMOS transistor). Conversely, compressive stress exerted on the channel region causes increase in driving current of the pMOS transistor, while causing reduction in driving current of the nMOS transistor.

As discussed, the strained silicon substrate including SiGe still faces the problems to be solved. Therefore, more simple way has been sought to improve characteristic of a MOS transistor.

According to the patent document 1, stress exerted to a gate electrode is applied to a channel region of a silicon substrate. As a result, channel characteristic of a MOS transistor is improved without the need of preparing a strained silicon substrate.

As discussed, tensile stress exerted on a channel region causes increase in driving current of an nMOS transistor, while causing reduction in driving current in a pMOS transistor. In contrast, compressive stress exerted on the channel region causes increase in driving current of the pMOS transistor, while causing reduction in driving current of the nMOS transistor. Therefore, stress to be exerted should differ at least between the nMOS and pMOS transistors.

It is thus required in the patent document 1 to employ different gate electrode materials and different deposition temperatures thereof between the nMOS and pMOS transistors. As a result, a gate electrode of the nMOS transistor and that of the pMOS transistor cannot be provided in the same process step, causing complication of the manufacturing steps.

SUMMARY OF THE INVENTION

It is therefore an object of the present invention to provide a semiconductor device allowing improvement in carrier mobility by applying tensile stress only to a channel region of a desired MOS transistor, and allowing simplification of manufacturing steps. It is still an object of the present invention to provide a method of this semiconductor device.

According to a first aspect of the present invention, the semiconductor device includes a polysilicon gate electrode provided on a silicon substrate. The gate electrode is subjected to compressive stress as internal stress therein, to apply tensile stress to the silicon substrate. Ions having a mass number of 70 or more are implanted into the gate electrode.

Tensile stress is applied to a region in the silicon substrate defined under a predetermined gate electrode. Therefore, lattice spacing is widened in this region of the silicon substrate. When this gate electrode is applied to an nMOS transistor, for example, enhancement of carrier mobility can be provided, thus contributing to performance improvement of the nMOS transistor.

According to a second aspect of the present invention, the method of manufacturing a semiconductor device includes the following steps (a) through (d). In the step (a), a non-single crystalline silicon gate electrode is provided on a silicon substrate. In the step (b), ions having a mass number of 70 or more are implanted into the gate electrode. In the step (c), a predetermined film is deposited at a temperature of 550.degree. C. or less, to cover the gate electrode including therein the ions having a mass number of 70 or more. In the step (d), thermal processing is performed at a temperature of more than 550.degree. C. while covering the gate electrode with the predetermined film.

Compressive residual stress is exerted on a predetermined gate electrode as internal stress therein, to apply tensile stress to a region in the silicon substrate defined under the gate electrode. Therefore, lattice spacing is widened in this region of the silicon substrate. When this gate electrode is applied to an nMOS transistor, for example, enhancement of carrier mobility can be provided, thus contributing to performance improvement of the nMOS transistor. Further, a mass number of ion to be implanted may vary according to the type of the gate electrode, or a part of the predetermined film on the predetermined gate electrode may be removed prior to thermal processing. Therefore, even when a plurality of gate electrodes are formed in the same step, only a desired gate electrode can easily be subjected to high compressive stress exerted thereon. As a result, simplification of the manufacturing steps is provided.

These and other objects, features, aspects and advantages of the present invention will become more apparent from the following detailed description of the present invention when taken in conjunction with the accompanying drawings.

BRIEF DESCRIPTION OF THE DRAWINGS

FIG. 11 illustrates a step of manufacturing a semiconductor device according to a second preferred embodiment of the present invention;

FIG. 12 illustrate a step of manufacturing a semiconductor device according to a third preferred embodiment of the present invention;

DESCRIPTION OF THE PREFERRED EMBODIMENTS

First Preferred Embodiment

The present inventors have found that when amorphous silicon including a large number of ions implanted therein undergoes thermal processing to form recrystallized polycrystalline silicon (polysilicon), volume expansion of silicon occurs. It has also been found that the amount of expansion of silicon is controlled largely by the mass number of ions implanted therein, and more particularly, that the amount of expansion increases as the mass number of implanted ions becomes larger (more specifically, 70 or more). It has been confirmed as well that the amount of expansion increases as the implant dose of ions increases.

FIGS. 1 through 9 illustrate steps of manufacturing a semiconductor device according to the first preferred embodiment of the present invention. In each one of FIGS. 1 through 9, the left half shows a region for forming an nMOS transistor (hereinafter called as an "nMOS region"), and the right half shows a region for forming a pMOS transistor (hereinafter called as a "pMOS region").

Figure 1:
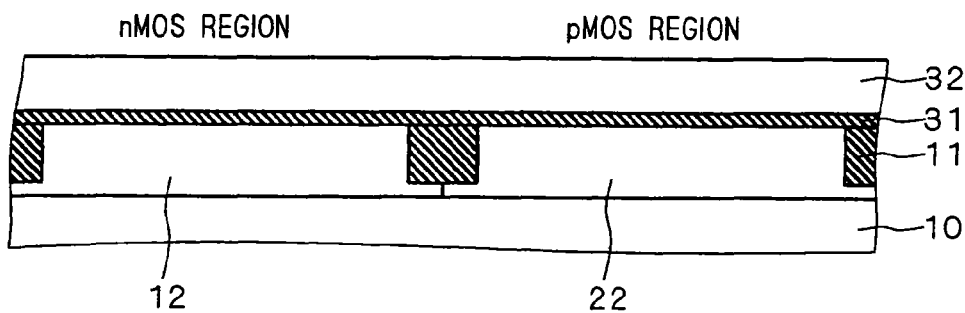
FIGS. 1 through 9 illustrate steps of manufacturing a semiconductor device according to a first preferred embodiment of the present invention.

First, an element isolation film 11, a p-well 12, and an n-well 22 are provided on a silicon substrate 10 by the conventional technique. Thereafter a silicon oxide film 31 as a gate insulating film is provided thereon. Subsequently, a silicon film 32 for forming gate electrodes is provided on the silicon oxide film 31 (FIG. 1). The silicon film 32 is not of a single crystalline structure, but either of an amorphous or polycrystalline structure.

Figure 2:
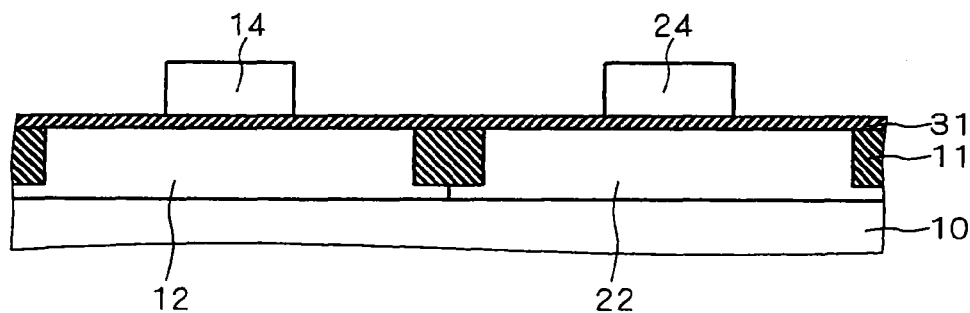

Next, the non-single crystalline silicon film 32 is patterned by photolithography, to form gate electrodes 14 and 24 on the p-well 12 and on the n-well 22, respectively (FIG. 2).

Figure 3:
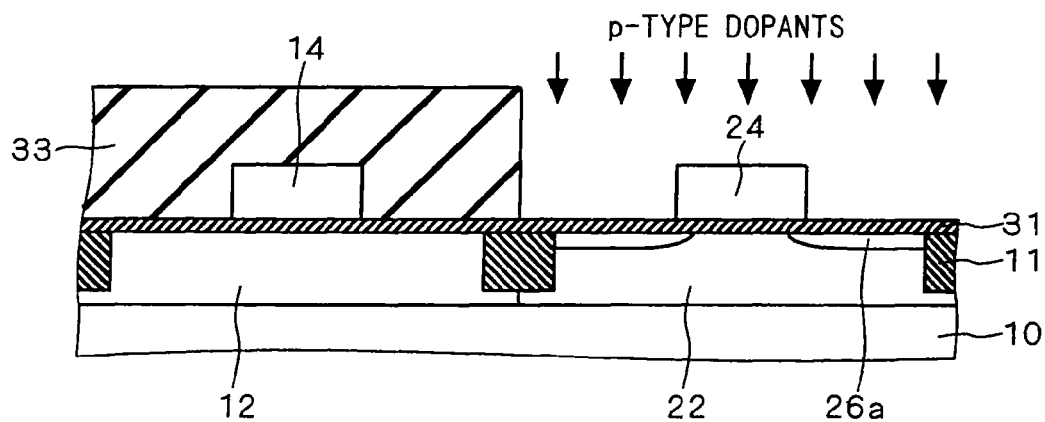

Thereafter, a resist mask 33 is formed by photolithography to have an opening in the pMOS region. Using the resist mask 33 and the gate electrode 24 as a mask, p-type dopants having a relatively small mass number such as B ions are then implanted, whereby a p-type source/drain extension layer 26a is formed in the n-well 22 at a relatively shallow depth (FIG. 3). At this time, ions are also implanted into the gate electrode 24, and therefore, non-single crystalline silicon forming the gate electrode 24 is partially amorphized. However, the degree of amorphization thus caused is low due to the relatively small mass number of the implanted ions.

Figure 4:
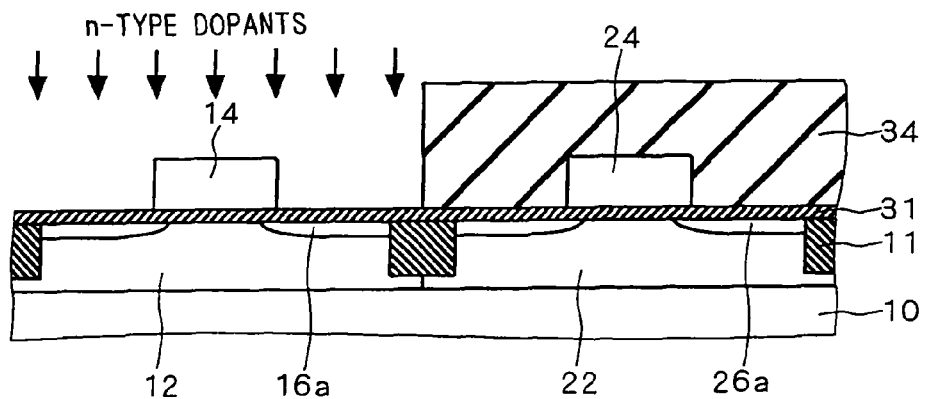

Next, a resist mask 34 is formed by photolithography to have an opening in the nMOS region. Using the resist mask 34 and the gate electrode 14 as a mask, n-type dopants having a relatively large mass number (70 or more) such as As ions or Sb ions are then implanted, whereby an n-type source/drain extension layer 16a is formed in the p-well 12 at a relatively shallow depth (FIG. 4). At this time, ions of a relatively large mass number are also implanted into the gate electrode 14. Accordingly, non-single crystalline silicon forming the gate electrode 14 is partially amorphized.

Figure 5:
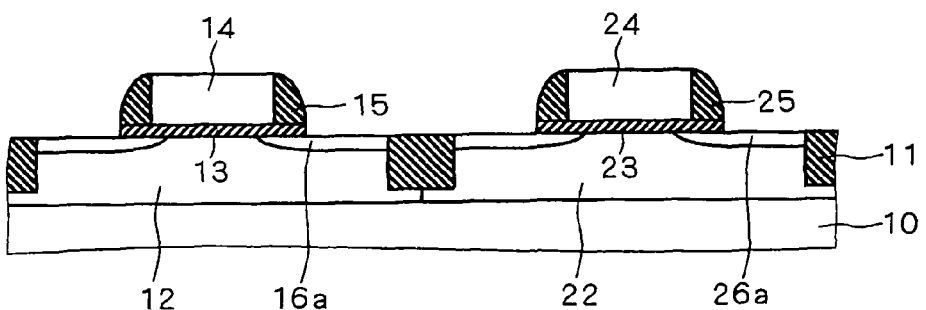

Thereafter, sidewalls 15 and 25 are provided on the respective side surfaces of the gate electrodes 14 and 24. further, the silicon oxide film 31 is etched, lo form gate insulating films 13 and 23 under the gate electrodes 14 and 24, respectively (FIG. 5). The deposition temperature for the sidewalls 15 and 25 is set to be less than the one at which recrystallization of silicon starts (about 550° C.).

Figure 6:
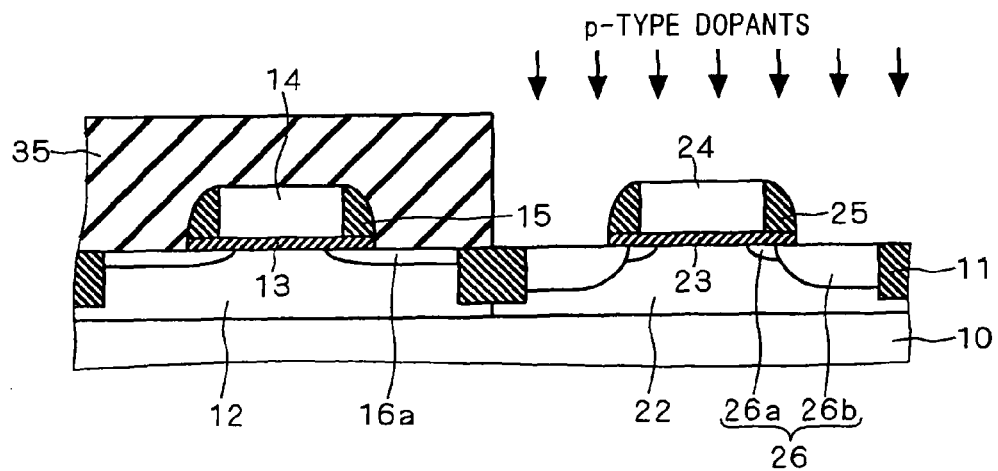

Subsequently, another resist mask 35 is formed jo have an opening in the pMOS region. Using the resist mask 35, the gate electrode 24 and the sidewall 25 as a mask, p-type dopants having a relatively small mass number such as B ions are then implanted with a dose of $4 \times 10^{15}/cm^2$ or more, whereby a p-type source/drain diffusion layer 26b is formed in the n-well 22 at a relatively great depth (FIG. 6). The p-type source/drain extension layer 26a and the p-type source/drain diffusion layer 26b form a p-type source/drain region 26. At this time, ions are also implanted into the gate electrode 24, and therefore, non-single crystalline silicon forming the gate electrode 24 is partially amorphized. However, the degree of amorphization thus caused is low due to the relatively small mass number of the implanted ions.

Figure 7:
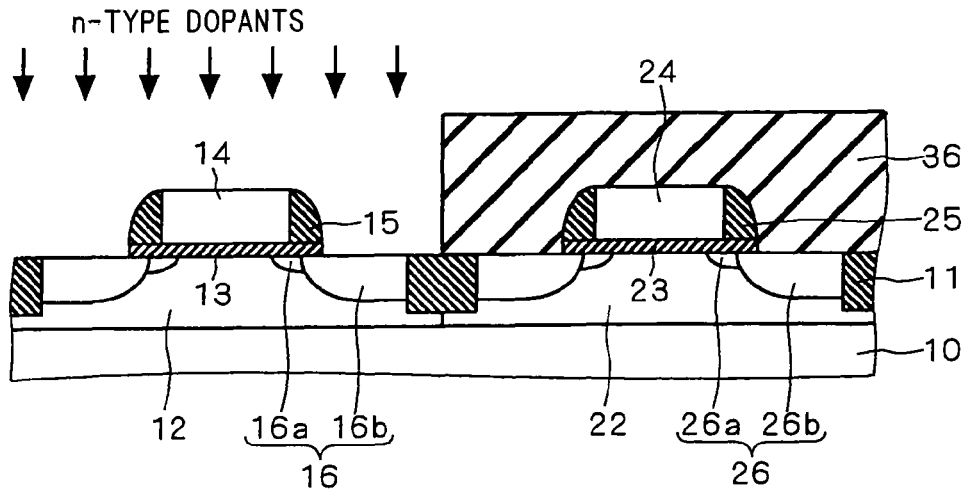

Thereafter, a resist mask 36 is formed to have an opening in the nMOS region. Using the resist mask 36, the gate electrode 14 and the sidewall 15 as a mask, n-type dopants having a relatively large mass number such as As ions or Sb ions are then implanted with a dose of $4 \times 10^{15}/cm^2$ or more, whereby an n-type source/drain diffusion layer 16b is formed in the p-well 12 at a relatively great depth (FIG. 7). The n-type source/drain extension layer 16a and the n-type source/drain diffusion layer 16b form an n-type source/drain region 16. At this time, ions of a relatively large mass number are also implanted into the gate electrode 14, and therefore, amorphization of non-single crystalline silicon forming the gate electrode 14 further proceeds.

Figure 8:
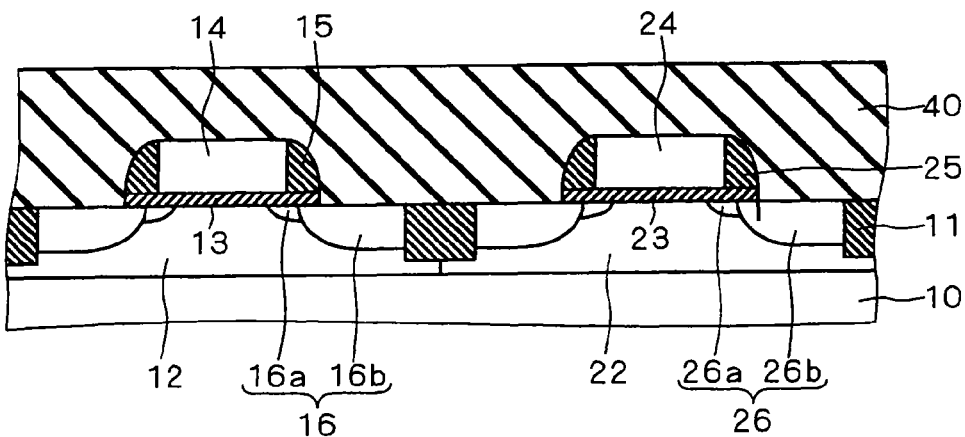

Subsequently, a silicon oxide film 40 is provided on the gate electrodes 14 and 24, and on the sidewalls 15 and 25 at a temperature which is less than the one at which recrystallization of silicon starts (about 550° C.) (FIG. 8).

Next, thermal processing such as RTA (rapid thermal annealing) is performed on the silicon oxide film 40 covering the gate electrodes 14 and 24, and the sidewalls 15 and 25, at a temperature ranging between about 950° C. and 1100° C. The period of this thermal processing may be 30 seconds or less including momentary annealing (spike annealing). As a result, damage caused by ion irradiation is repaired, and the dopants are activated. At the same time, recrystallization of amorphous silicon occurs, whereby the gate electrodes 14 and 24 turn into polysilicon.

Those ions of a relatively large mass number (70 or more) such as As ions or Sb ions are implanted in large quantity into the gate electrode 14 of the nMOS transistor. Hence, the gate electrode 14 tends to expand. However, as the surfaces of the gate electrode 14 and the sidewall 15 are covered with the silicon oxide film 40, the gate electrode 14 can hardly expand. The tendency of the gate electrode 14 to expand causes high compressive residual stress as internal stress therein, thus applying tensile stress to a channel region defined under the gate electrode 14.

In contrast, only those ions of a relatively small mass number are implanted into the gate electrode 24 of the pMOS transistor. Hence, the gate electrode 24 scarcely tends to expand, whereby little residual stress is exerted on the gate electrode 24. As a result, there occurs substantially no stress to be applied to a channel region defined under the gate electrode 24.

Figure 9:
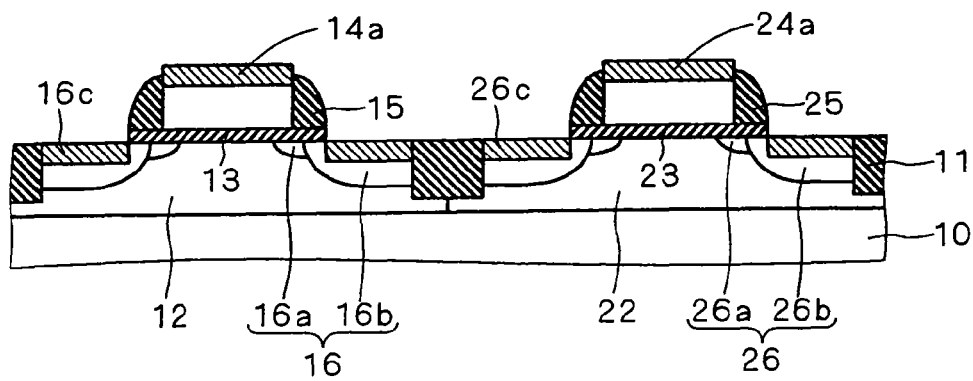

As an exemplary way of silicidation of the gate electrodes 14 and 24, and the upper portions of the source/drain regions 16 and 26, the silicon oxide film 40 is removed, and thereafter, a metal film such as Co film is entirely deposited by sputtering. Next, thermal processing is performed at a relatively low temperature of about 350° C. to 550.° C., whereby this metal film is reacted with the gate electrodes 14 and 24, and with the source/drain regions 16 and 26. Then, unreacted metal film remaining on the element isolation film 11, and on the sidewalls 15, 25 is selectively removed, followed by high-temperature thermal processing. As a result, silicide layers 14a and 24a are formed in the upper portions of the gate electrodes 14 and 24, respectively, and silicide layers 16c and 26c are formed in the upper portions of the source/drain regions 16 and 26, respectively (FIG. 9).

Thereafter, predetermined device elements including interlayer insulating film, contact, interconnect line, and the like, are provided, which is the completion of the manufacturing process of the semiconductor device.

Figure 10A:
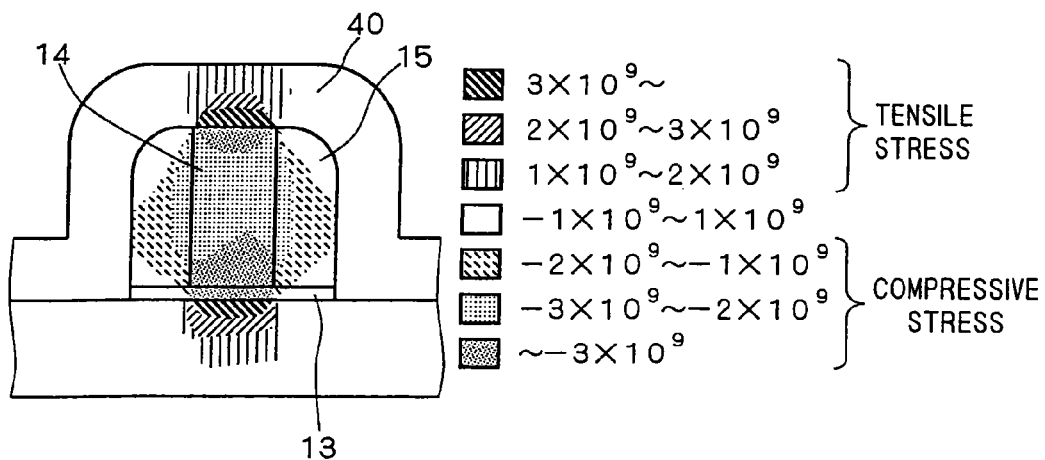
FIGS. 10A and 10B illustrate stress distribution in a direction of channel length in an nMOS transistor of the semiconductor device according to the first preferred embodiment of the present invention, and in the nMOS transistor of the background-art semiconductor device, respectively.
Figure 10B:
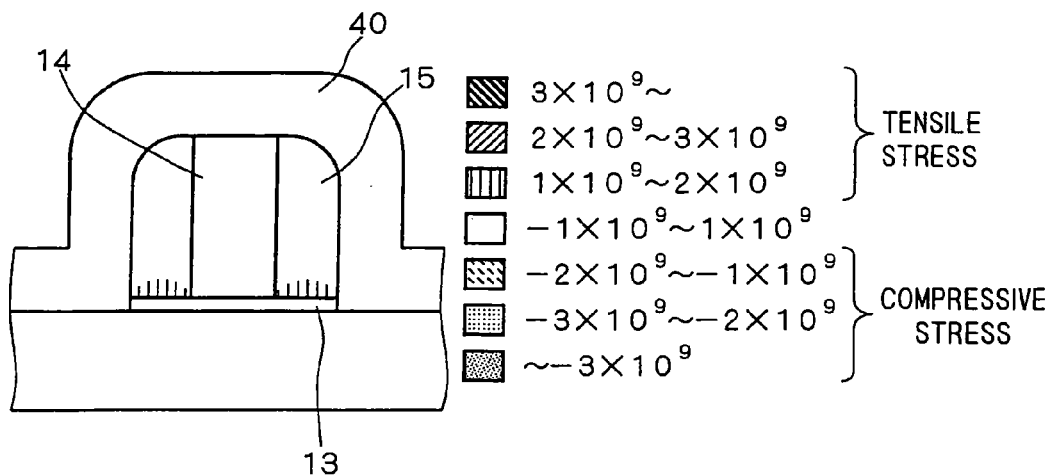

FIG. 10A illustrates stress distribution in cross section in a direction of channel length in the nMOS transistor according to the first preferred embodiment, and FIG. 10B illustrates stress distribution in cross section in a direction of channel length of the background-art nMOS transistor, namely, the transistor including the gate electrode 14 into which only ions of a relatively small mass number are implanted. It is seen that in the nMOS transistor of the first preferred embodiment, high compressive residual stress is exerted on the gate electrode 14, and tensile stress is applied to the channel region. Therefore, the lattice spacing of silicon in the channel region of the nMOS transistor is widened and carrier mobility is enhanced, resulting in improvement in characteristic of the MOS transistor.

In contrast, little residual stress is exerted on the gate electrode 24 of the pMOS transistor, and thus there occurs substantially no stress to be applied to the channel region under the gate electrode 24. As discussed, application of tensile stress to the channel region of the pMOS transistor provides no effectiveness, as it causes reduction in drain current of the pMOS transistor. That is, in the device including both pMOS and NMOS transistors, tensile stress is preferably be applied only to the channel region of the nMOS transistor. In the first preferred embodiment, no tensile stress is applied to the channel region of the pMOS transistor. As a result, while suppressing reduction in drain current of the pMOS transistor, improvement in characteristic of the nMOS transistor is realized.

In addition, in the first preferred embodiment, ions (for formation of the n-type source/drain region 16) to be implanted into the gate electrode 14 have a relatively large mass number, and ions (for formation of the p-type source/drain region 26) to be implanted into the gate electrode 24 have a relatively small mass number. As a result, only the channel region of the nMOS transistor undergoes high tensile stress applied thereto. That is, even when the gate electrodes 14 and 24 are formed in the same step, as the n-type dopants and the p-type dopants to be implanted in the subsequent step have different mass numbers, the degrees of stress to be applied to the respective channel regions of the nMOS and pMOS transistors can vary therebetween. Namely, formation of the nMOS and pMOS transistors does not require separate steps, allowing simplification of the manufacturing steps.

As discussed, when amorphous silicon including a large number of ions implanted therein is recrystallized to turn into polysilicon, the tendency of silicon to expand increases as the mass number of the implanted ions increases. Due to this, the greater the mass number of the implanted ions into the gate electrode 14, the higher the compressive residual stress thereon. As a result, tensile stress to be applied to the channel region becomes higher, providing enhanced effectiveness of the first preferred embodiment. Further, the compressive residual stress on the gate electrode 14 becomes higher as the dose of the implanted ions implanted therein increases. In the foregoing discussion, the exemplary dose of ions for forming the n-type source/drain diffusion layer 16b is $4 \times 10^{15}/cm^2$ or more, which is the standard amount therefor. The applicability of the present invention is not limited to this. The dose of approximately $4 \times 10^{15}/cm^2$ is sufficient enough to maintain effectiveness of the present invention. On the other hand, increased effectiveness can be achieved by the greater amount. The compressive stress on the gate electrode 14 itself is generated with a dose less than $4 \times 10^{15}/cm^2$.

In the step of FIG. 8, the silicon oxide film 40 is provided as a predetermined film to be on the gate electrodes 14 and 24. As long as the temperature for forming this film satisfies the condition that it should be less than the one for starting recrystallization of silicon (about 550° C.), alternative materials may be used for this predetermined film. As long as compressive residual stress is exerted on the gate electrode 14, alternative films such as metal film, silicide film, or stacked film thereof, may be employed. In this case, after compressive residual stress is exerted on the gate electrode 14 by thermal processing, this alternative film is removed. Thereafter, an insulating film such as silicon oxide film is further provided.

The compressive residual stress exerted on the gate electrode 14 also becomes greater when the predetermined film 40 has a property that it shrinks by the foregoing thermal processing (a silicon oxide film has such property). It is confirmed by the present inventors that the higher the temperature for the thermal processing for recrystallization of amorphous silicon, and the greater the thickness of the predetermined film 40, the greater the compressive residual stress on the gate electrode 14, whereby improved carrier mobility is provided.

In the first preferred embodiment, an ordinary silicon substrate is used for forming a MOS transistor. Alternatively, it may be a "strained silicon substrate" as discussed in the foregoing description of the background art. In this case, carrier mobility in the channel region of the nMOS transistor can be reliably improved to a greater degree.

Second Preferred Embodiment

As discussed in the first preferred embodiment, ions having a relatively small mass number are implanted into the gate electrode 24, and therefore, there will be little residual stress to be applied to the gate electrode 24 even with the existence of the silicon oxide film 40 thereon. In the case of ion implantation in large quantity, however, there may be some compressive residual stress to be exerted on the gate electrode 24 even when the implanted ions have a small mass number.

The steps of manufacturing a semiconductor device according to the second preferred embodiment of the present invention will be given. First, following the same steps as those of the first preferred embodiment shown in FIGS. 1 through 8, the NMOS and pMOS transistors are provided. Further provided thereon is the silicon oxide film 40. Next, the silicon oxide film 40 in the pMOS region is removed so that an opening is defined therein, as shown in FIG. 11.

Thermal processing is thereafter performed at a temperature ranging between about 950°. C. and 1100° C., to repair damage and to activate the dopants. At the same time, recrystallization of amorphous silicon occurs, whereby the gate electrodes 14 and 24 turn into polysilicon.

The surfaces of the gate electrode 14 and the sidewall 15 of the NMOS transistor are covered with the silicon oxide film 40. Therefore, the tendency of the gate electrode 14 to expand causes high compressive residual stress as internal stress therein, thus applying tensile stress to the channel region under the gate electrode 14.

On the other hand, the surfaces of the gate electrode 24 and the sidewall 25 of the pMOS transistor are exposed without being covered with the silicon oxide film 40. Accordingly, even when the gate electrode 24 expands slightly, there will be little residual stress on the gate electrode 24. As a result, as compared with the first preferred embodiment, tensile stress to be exerted on the channel region of the pMOS transistor can be suppressed to a greater degree.

Third Preferred Embodiment

In the first and second preferred embodiments, ion implantation for forming the n-type source/drain diffusion layer 16b is also operative to implant ions into the gate electrode 14 for expansion thereof. Alternatively, ion implantation step into the gate electrode 14 may be performed separately from the implantation step for formation of the n-type source/drain diffusion layer 16b.

The steps of manufacturing a semiconductor device according to the third preferred embodiment of the present invention will be given. First, following the same steps as those of the first preferred embodiment shown in FIGS. 1 through 6, the NMOS and pMOS transistors are provided. Next, a resist mask 36 is formed to have an opening in the pMOS region. Thereafter, prior to formation of the n-type source/drain diffusion layer 16b in the nMOS region, electrically inactive ions having a relatively large mass number (70 or more) such as Ge ions are entirely implanted with a dose of $4 \times 10^{15}/cm^2$ or more, as shown in FIG. 12. At this time, ions are implanted into the source/drain region of the nMOS transistor as well as into the gate electrode 14. Those ions implanted in this step are electrically inactive, and therefore, they are not operative to serve as dopants.

Thereafter, as shown in FIG. 7, n-type dopants are implanted to form the n-type source/drain diffusion layer 16b. The n-type dopants to be implanted in this step may be those having a relatively small mass number such as P ions.

The subsequent steps are the same as those of the first preferred embodiment. Namely, the silicon oxide film 40 is provided on the gate electrodes 14 and 24, and on the sidewalls 15 and 25, and thereafter, thermal processing is performed at a temperature ranging between about 950° C. and 1100° C. As a result, recrystallization of amorphous silicon occurs, whereby the gate electrodes 14 and 24 turn into polysilicon.

As mentioned, electrically inactive ions having a relatively large mass number are implanted in large quantity into the gate electrode 14 of the nMOS transistor. Further, the surfaces of the gate electrode 14 and the sidewall 15 are covered with the silicon oxide film 40. Accordingly, the tendency of the gate electrode 14 to expand causes compressive residual stress as internal stress therein, thus applying tensile stress to the channel region under the gate electrode 14.

In contrast, only those ions of a relatively small mass number are implanted into the gate electrode 24 of the pMOS transistor. Hence, little residual stress is exerted on the gate electrode 24. As a result, there occurs substantially no stress to be applied to the channel region under the gate electrode 24.

Fourth Preferred Embodiment

In a silicon substrate subjected to high stress applied thereto, crystal defect generally occurs with high probability. In a transistor provided on the silicon substrate having crystal defect, increase in leakage current such as junction leakage current, gate current, or subthreshold leakage current, may occur. That is, the nMOS transistor of the present invention may encounter the problem of crystal defect resulting from tensile stress applied to the channel region. Therefore, the nMOS transistor of the present invention may suffer from an increased amount of leakage current as compared with the one in the background art.

For example, a logic section of an ordinary semiconductor device is intended mainly for high-speed operation and response, giving priority to high-speed operation even with the existence of some leakage current. On the other hand, in a memory section of an SRAM or DRAM, or in a logic section of an LSI for mobile communication system, for example, even slight increase in power consumption resulting from leakage current should be controlled. In view of this, the MOS transistor according to the present invention may provide effectiveness for a circuit section placing priority to high-speed operation (hereinafter referred to as a "high-speed circuit section"), while it may be unsuitable for a circuit section requiring suppression of power consumption (hereinafter referred to as a "low-power circuit section"). In other words, it is preferable to use the MOS transistor of the present invention only in the high-speed circuit section of a semiconductor device, and to use the conventional MOS transistor in the low-power circuit section.

Figure 13:
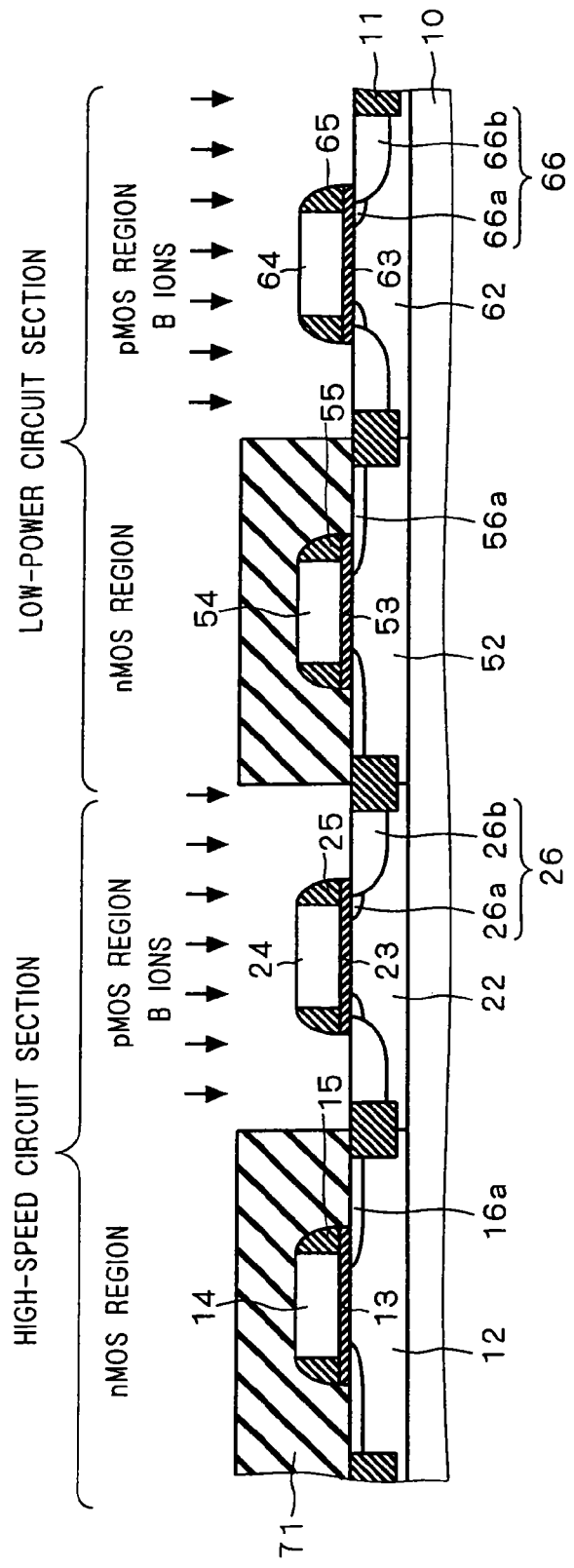
FIGS. 13 through 16 illustrate steps of manufacturing a semiconductor device according to a fourth preferred embodiment of the present invention.

FIGS. 13 through 16 illustrate steps of manufacturing a semiconductor device according to the fourth preferred embodiment of the present invention. As indicated in FIG. 13, in each one of FIGS. 13 through 16, the left half shows a high-speed circuit section placing priority to high-speed operation, and the right half shows a low-power circuit section requiring suppression of power consumption. Assuming that the high-speed circuit section and the low-power circuit section each comprise an nMOS region for forming an nMOS transistor and a pMOS region for forming a pMOS transistor, the steps of manufacturing a semiconductor device according to the fourth preferred embodiment will be given.

First, an element isolation film 11, p-wells 12 and 52, and n-wells 22 and 62 are provided on a silicon substrate 10 by the conventional technique. Thereafter, following the same steps as those of the first preferred embodiment shown in FIGS. 1 through 5, a gate insulating film 13, a gate electrode 14, a sidewall 15, and an n-type source/drain extension layer 16a are provided in the nMOS region of the high-speed circuit section. Provided in the pMOS region of the high-speed circuit section are a gate insulating film 23, a gate electrode 24, a sidewall 25, and a p-type source/drain extension layer 26a. Provided in the nMOS region of the low-power circuit section are a gate insulating film 53, a gate electrode 54, a sidewall 55, and an n-type source/drain extension layer 56a. Further, a gate insulating film 63, a gate electrode 64, a sidewall 65, and a p-type source/drain extension layer 66a are provided in the pMOS region of the low-power circuit section.

Subsequently, a resist mask 71 is formed to have an opening in the respective pMOS regions of the high-speed circuit section and the low-power circuit section. Using the resist mask 71, the gate electrodes 24 and 64, and the sidewalls 25 and 65 as a mask, p-type dopants having a relatively small mass number such as B ions are then implanted with a dose of $4 \times 10^{15}/cm^2$ or more, whereby a p-type source/drain diffusion layer 26b and a p-type source/drain diffusion layer 66b are formed (FIG. 13). The p-type source/drain extension layer 26a and the p-type source/drain diffusion layer 26b form a p-type source/drain region 26, and the p-type source/drain extension layer 66a and the p-type source/drain diffusion layer 66b form a source/drain region 66. At this time, ions are also implanted into the gate electrodes 24 and 64.

Figure 14:
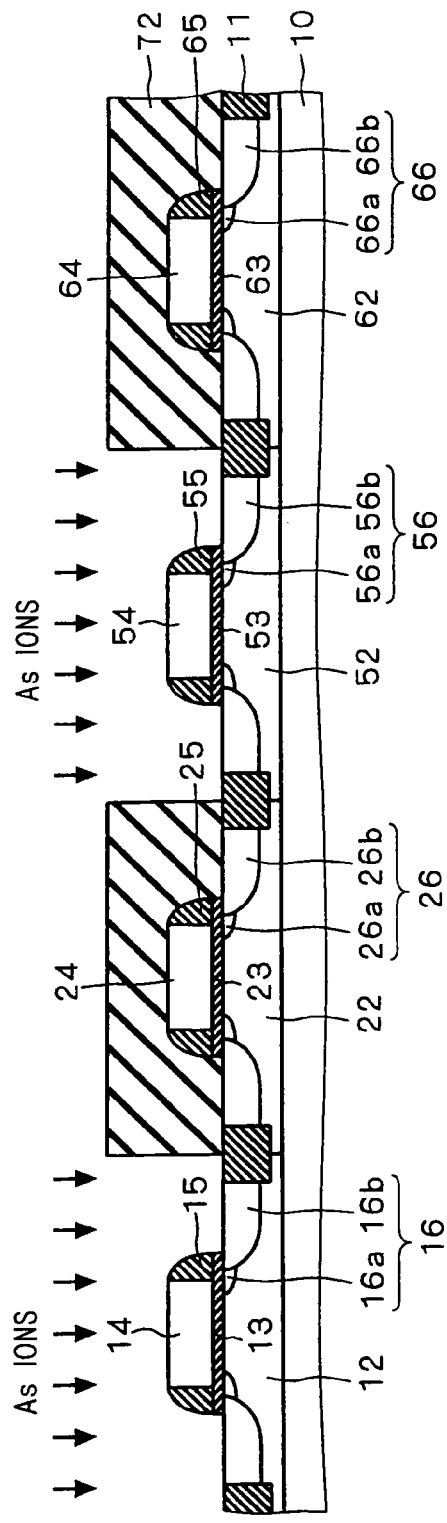

Next, a resist mask 72 is formed to have an opening in the respective NMOS regions of the high-speed circuit section and the low-power circuit section. Using the resist mask 72, the gate electrodes 14 and 54, and the sidewalls 15 and 55 as a mask, n-type dopants having a relatively large mass number such as As ions or Sb ions are implanted, whereby an n-type source/drain diffusion layer 16b and an n-type source/drain diffusion layer 56b are formed (FIG. 14). The n-type source/drain extension layer 16a and the n-type source/drain diffusion layer 16b form an n-type source/drain region 16, and the n-type source/drain extension layer 56a and the n-type source/drain diffusion layer 56b form an n-type source/drain region 56. At this time, ions are also implanted into the gate electrodes 14 and 54.

Figure 15:
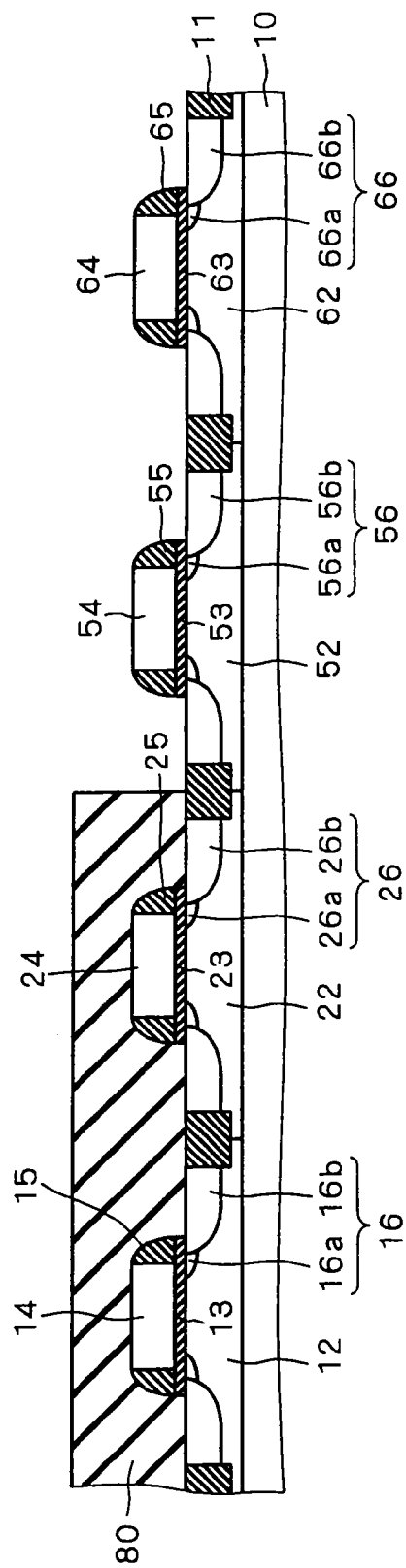
Figure 16:
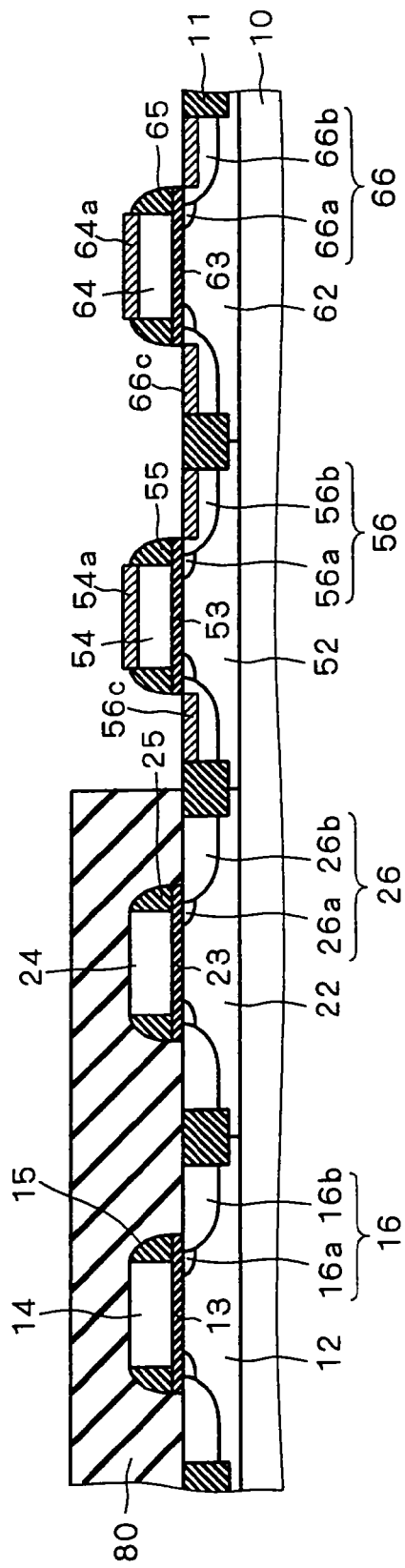

Next, a silicon oxide film 80 is provided to cover the high-speed circuit section while exposing the low-power circuit section. More particularly, the silicon oxide film 80 is provided on the gate electrodes 14 and 24, and on the sidewalls 15 and 25 of the high-speed circuit section, at a temperature which is less than the one at which recrystallization of silicon starts (about 550° C.) (FIG. 15).

Thereafter, thermal processing is performed on the silicon oxide film 80 covering the gate electrodes 14 and 24, and the sidewalls 15 and 25, at a temperature ranging between about 950° C. and 1100° C., causing recrystallization of amorphous silicon. As a result, the gate electrodes 14, 24, 54 and 64 turn into polysilicon.

Those ions of a relatively large mass number (70 or more) such as As ions or Sb ions are implanted in large quantity into the gate electrode 14 of the nMOS transistor of the high-speed circuit section. Further, the surfaces of the gate electrode 14 and the sidewall 15 are covered with the silicon oxide film 80. As a result, high compressive residual stress is exerted as internal stress on the gate electrode 14, thus applying tensile stress to the channel region under the gate electrode 14.

Those ions of a relatively large mass number such as As ions or Sb ions are further implanted in large quantity into the gate electrode 54 of the nMOS transistor of the low-power circuit section. However, the surfaces of the gate electrode 54 and the sidewall 55 are exposed, whereby little residual stress is exerted on the gate electrode 54. As a result, there occurs substantially no stress to be applied to the channel region under the gate electrode 54.

Only those ions of a relatively small mass number are implanted into the gate electrodes 24 and 64 of the respective pMOS transistors of the high-speed circuit section and the low-power circuit section, and therefore, little residual stress is exerted on the gate electrodes 24 and 64. As a result, there occurs substantially no stress to be applied to the respective channel regions under the gate electrodes 24 and 64.

As discussed, according to the manufacturing steps of the fourth preferred embodiment, high tensile stress is applied only to the channel region of the NMOS transistor of the high-speed circuit section, thus allowing performance improvement. Further, substantially no stress is applied to the channel region of the pMOS transistor of the high-speed circuit section, and to the respective channel regions of the pMOS and nMOS transistors of the low-power circuit section, whereby increase in leakage current resulting from crystal defect can be controlled.

As an exemplary way of silicidation of the gate electrode and source/drain region of a certain MOS transistor, a metal film such as Co film is deposited by sputtering, followed by thermal processing at a relatively low temperature ranging between 350° C. and 550° C., whereby the metal film and silicon are reacted. Then unreacted metal film remaining on the insulating film is selectively removed. Thereafter high-temperature thermal processing follows.

In an LSI for mobile communication system, for example, silicidation of the gate electrode and source/drain region of the MOS transistor of the low-power circuit section is required in many cases. For such silicidation, the silicon oxide film 80 provided in the foregoing step to cover the high-speed circuit section while exposing the low-power circuit section may be further operative to serve as a mask. After silicidation using the silicon oxide film 80 as a mask, silicide layers 54a and 64a are formed in the upper portions of the gate electrodes 54 and 64 of the low-power circuit section, respectively, and silicide layers 56c and 66c are formed in the upper portions of the source/drain regions 56 and 66 of the low-power circuit section, respectively.

According to the fourth preferred embodiment, for recrystallization of amorphous silicon, the silicon oxide film 80 has such a shape that the low-power circuit section is exposed. Therefore, application of high tensile stress can be limited to the channel region of the nMOS transistor of the high-speed circuit section. That is, even when the gate electrodes 14, 24, 54 and 64 are all provided in the same step, only a channel region of a certain nMOS transistor can be subjected to high tensile stress applied thereto. As a result, simplification of the manufacturing steps is realized.

Fifth Preferred Embodiment

Similar to the fourth preferred embodiment, in the fifth preferred embodiment of the present invention, the MOS transistor according to the present invention is applied only to a high-speed section of a semiconductor device, while the conventional MOS transistor is applied to a low-power section thereof.

FIGS. 17 through 20 illustrate steps of manufacturing a semiconductor device according to the fifth preferred embodiment. Similar to FIG. 13, in each one of FIGS. 17 through 20, the left half shows a high-speed circuit section placing priority to high-speed operation, and the right half shows a low-power circuit section requiring suppression of power consumption. The high-speed circuit section and the low-power circuit section each comprise nMOS and pMOS regions.

The steps of manufacturing the semiconductor device according to the fifth preferred embodiment will be described with reference to FIGS. 17 through 20. First, similar to the fourth preferred embodiment, an element isolation film 11, p-wells 12 and 52, and n-wells 22 and 62 are provided on a silicon substrate 10. Thereafter, a gate insulating film 13, a gate electrode 14, a sidewall 15, and an n-type source/drain extension layer 16a are provided in the nMOS region of the high-speed circuit section. Provided in the pMOS region of the high-speed circuit section are a gate insulating film 23, a gate electrode 24, a sidewall 25, and a p-type source/drain extension layer 26a. Provided in the nMOS region of the low-power circuit section are a gate insulating film 53, a gate electrode 54, a sidewall 55, and an n-type source/drain extension layer 56a. Further, a gate insulating film 63, a gate electrode 64, a sidewall 65, and a p-type source/drain extension layer 66a are provided in the pMOS region of the low-power circuit section. In the fifth preferred embodiment, for formation of the n-type source/drain extension layers 16a and 56a, n-type dopants having a relatively small mass number such as P ions are implanted.

Subsequently, a resist mask 71 is formed to have an opening in the respective pMOS regions of the high-speed circuit section and the low-power circuit section. Using the resist mask 71, the gate electrodes 24 and 64, and the sidewalls 25 and 65 as a mask, p-type dopants having a relatively small mass number such as B ions are then implanted with a dose of $4\times10^{15}/cm^2$ or more, whereby a p-type source/drain diffusion layer 26b and a p-type source/drain diffusion layer 66b are formed (FIG. 13). The p-type source/drain extension layer 26a and the p-type source/drain diffusion layer 26b form a p-type source/drain region 26, and the p-type source/drain extension layer 66a and the p-type source/drain diffusion layer 66b form a source/drain region 66. At this time, ions are also implanted into the gate electrodes 24 and 64.

Figure 17:
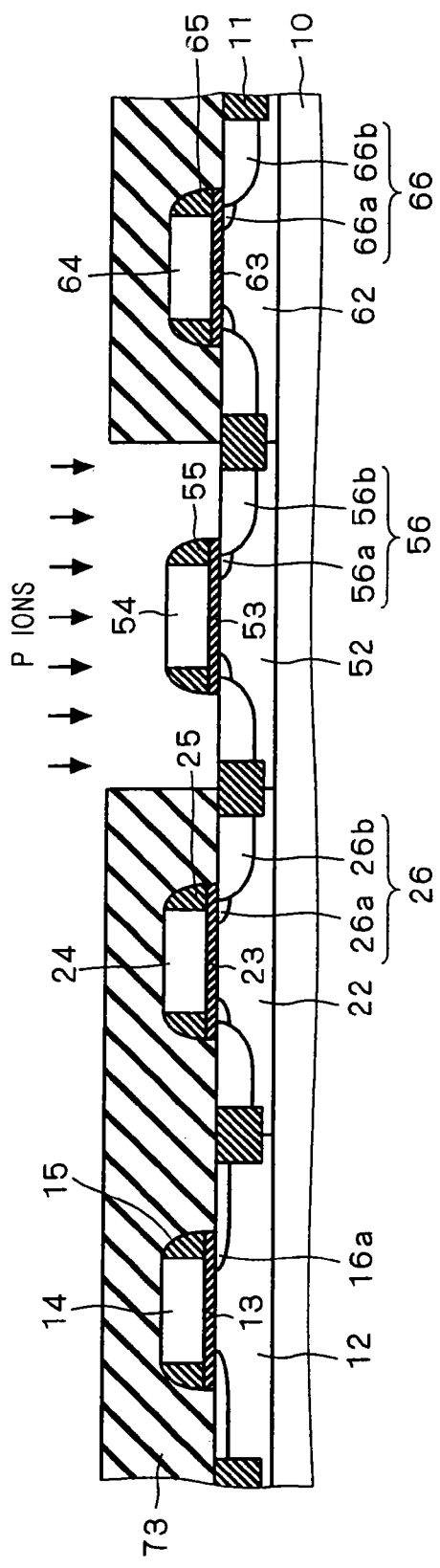
FIGS. 17 through 20 illustrate steps of manufacturing a semiconductor device according to a fifth preferred embodiment of the present invention.

Next, a resist mask 73 is formed to have an opening in the nMOS region of the low-power circuit section. Using the resist mask 73, the gate electrode 54 and the sidewall 55 as a mask, n-type dopants having a relatively small mass number such as P ions are implanted, whereby an n-type source/drain diffusion layer 56b is formed (FIG. 17). The n-type source/drain extension layer 56a and the n-type source/drain diffusion layer 56b form an n-type source/drain region 56. At this time, ions are also implanted into the gate electrode 54.

Figure 18:
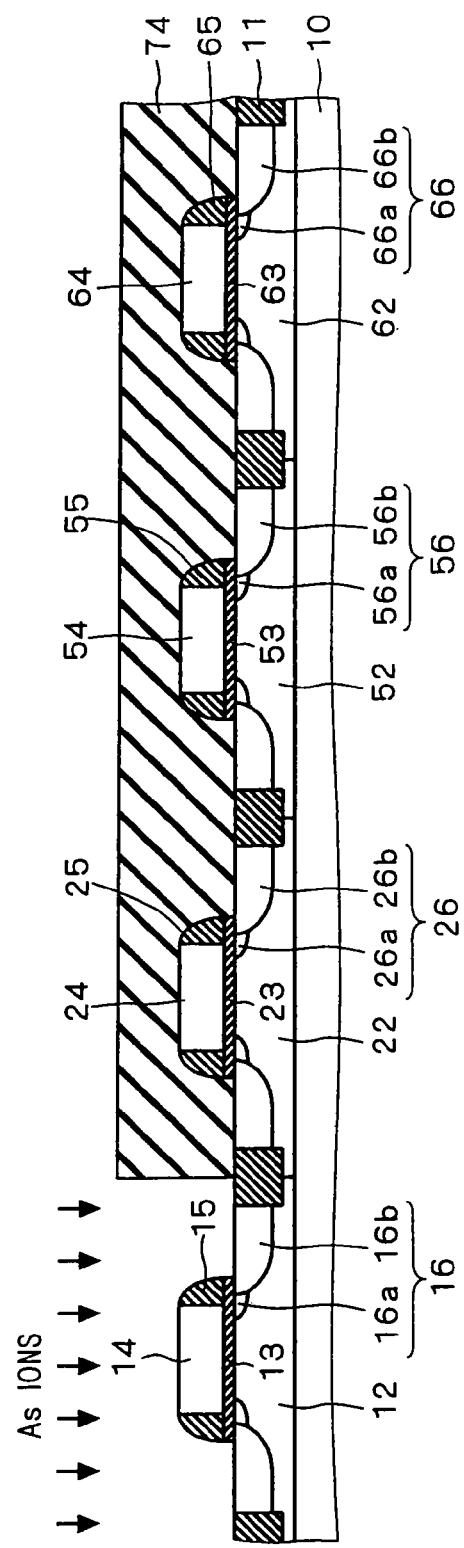

Thereafter, a resist mask 74 is formed to have an opening in the nMOS region of the high-speed circuit section. Using the resist mask 74, the gate electrode 14 and the sidewall 15 as a mask, n-type dopants having a relatively large mass number such as As ions or Sb ions are implanted, whereby an n-type source/drain diffusion layer 16b is formed (FIG. 18). The n-type source/drain extension layer 16a and the n-type source/drain diffusion layer 16b form an n-type source/drain region 16. At this time, ions are also implanted into the gate electrode 14.

Figure 19:
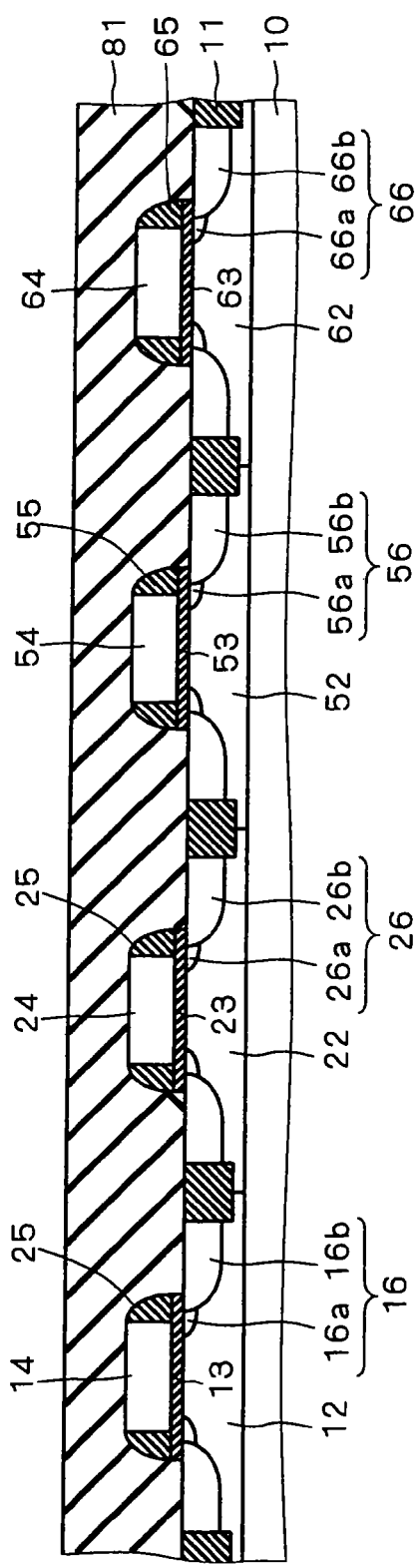
Figure 20:
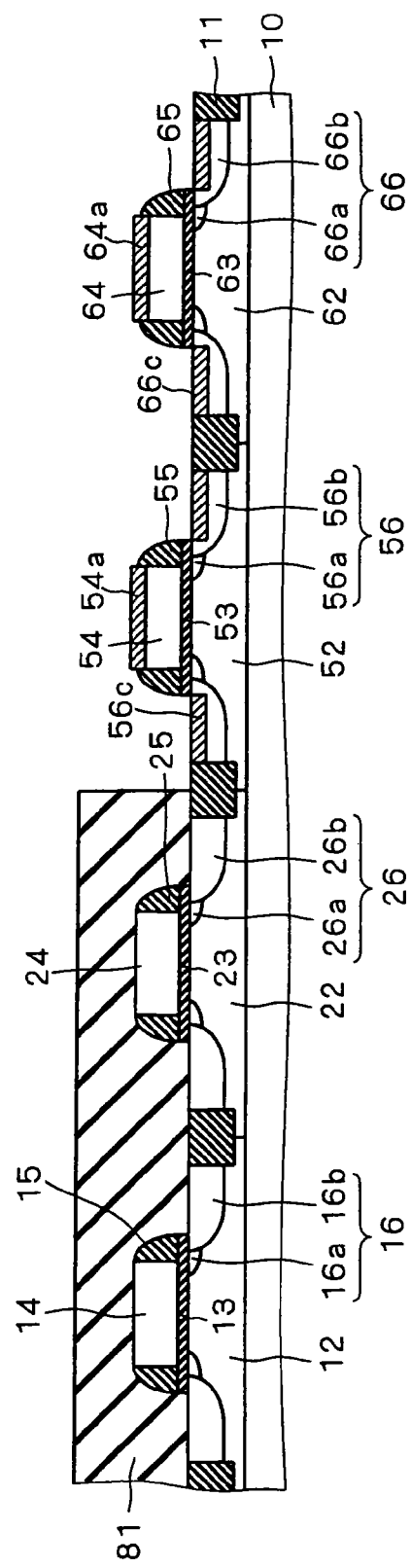

Next, a silicon oxide film 81 is provided to cover the high-speed circuit section and the low-power circuit section. More particularly, the silicon oxide film 81 is provided on the gate electrodes 14, 24, 54 and 64, and on the sidewalls 15, 25, 55 and 65, at a temperature which is less than the one at which recrystallization of silicon starts (about 550° C.) (FIG. 19).

Thereafter, thermal processing is performed on the silicon oxide film 81 covering the gate electrodes 14, 24, 54 and 64, and the sidewalls 15, 25, 55 and 65, at a temperature ranging between about 950° C. and 1100° C., causing recrystallization of amorphous silicon. As a result, the gate electrodes 14, 24, 54 and 64 turn into polysilicon.

Those ions of a relatively large mass number (70 or more) such as As ions or Sb ions are implanted into the gate electrode 14 of the nMOS transistor of the high-speed circuit section. Further, the surfaces of the gate electrode 14 and the sidewall 15 are covered with the silicon oxide film 81. As a result, high compressive residual stress is exerted as internal stress on the gate electrode 14, thus applying tensile stress to the channel region under the gate electrode 14.

Only those ions of a relatively small mass number are implanted into the gate electrode 54 of the nMOS transistor of the low-power circuit section, whereby little residual stress is exerted on the gate electrode 54. As a result, there occurs substantially no stress to be applied to the channel region under the gate electrode 54.

Only those ions of a relatively small mass number are further implanted into the gate electrodes 24 and 64 of the respective pMOS transistors of the high-speed circuit section and the low-power circuit section, and therefore, little residual stress is exerted on the gate electrodes 24 and 64. As a result, there occurs substantially no stress to be applied to the respective channel regions under the gate electrodes 24 and 64.

As discussed, according to the manufacturing steps of the fifth preferred embodiment, high tensile stress is applied only to the channel region of the NMOS transistor of the high-speed circuit section, thus allowing performance improvement. Further, substantially no stress is applied to the channel region of the pMOS transistor of the high-speed circuit section, and to the respective channel regions of the pMOS and nMOS transistors of the low-power circuit section, whereby increase in leakage current resulting from crystal defect can be controlled.

In an LSI for mobile communication system, for example, for silicidation of the gate electrode and source/drain region of the MOS transistor of the low-power circuit section, an opening is defined in the silicon oxide film 81 to expose the low-power circuit section. Using this silicon oxide film 81 as a mask, silicidation is performed. As a result, silicide layers 54a and 64a are formed in the upper portions of the gate electrodes 54 and 64 of the low-power circuit section, respectively, and silicide layers 56c and 66c are formed in the upper portions of the source/drain regions 56 and 66 of the low-power circuit section, respectively.

According to the fifth preferred embodiment, n-type dopants to be implanted into the high-speed circuit section and into the low-power circuit section have different mass numbers therebetween. Therefore, application of high tensile stress can be limited to the channel region of the nMOS transistor of the high-speed circuit section. That is, even when the gate electrodes 14, 24, 54 and 64 are all provided in the same step, only a channel region of a certain nMOS transistor can be subjected to high tensile stress applied thereto.

Sixth Preferred Embodiment

As discussed, the nMOS transistor according to the present invention is likely to suffer from crystal defect, which may result in leakage current such as junction leakage current, gate current, or subthreshold leakage current of the MOS transistor. That is, the nMOS transistor of the present invention will suffer from an increased amount of leakage current as compared with the one in the background art. The sixth preferred embodiment of the present invention is directed to solve this problem.

Figure 21:
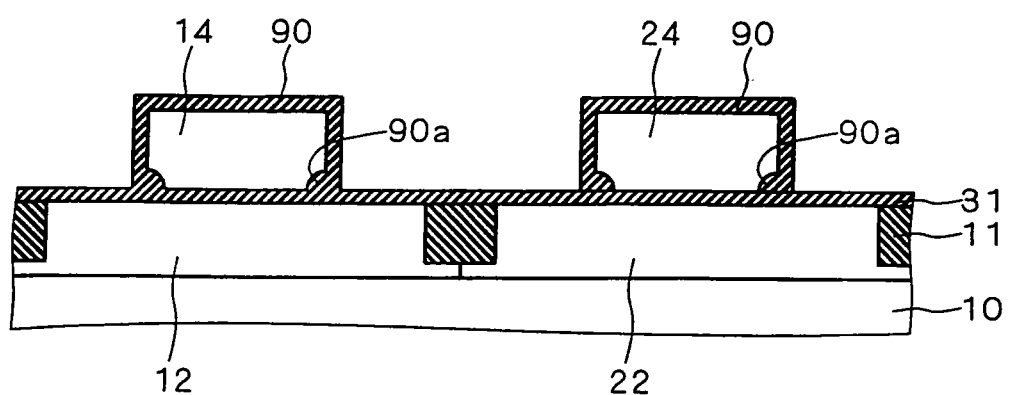
FIG. 21 illustrates a step of manufacturing a semiconductor device according to a sixth preferred embodiment of the present invention.

By way of example, after the gate electrodes 14 and 24 are provided as in FIG. 2 following the same step as that of the first preferred embodiment, the surfaces of the gate electrodes 14 and 24, and of the silicon substrate 10 are oxidized. More precisely, the silicon oxide film 31 remains on the silicon substrate 10 at this time, and therefore, it is reoxidized. The resultant structure is as given in FIG. 21, in which a silicon oxide film 90 is provided on the surfaces of the gate electrodes 14 and 24, and bird's beaks 90a are defined at respective edge portions of the gate electrodes 14 and 24. The subsequent steps are the same as those of FIGS. 3 through 9, and therefore, the description thereof is omitted.

Resulting from the existence of the bird's beaks 90a, the insulating film has a larger thickness at the edge portions of the gate electrodes 14 and 24, providing suppression of tunneling current and relaxation of gate electric field. As a result, subthreshold leakage current can be reduced, allowing suppression of increase in leakage current of the MOS transistor. For this reason, the sixth preferred embodiment is effectively applied to the MOS transistor having a probability of increase in leakage current, especially to the nMOS transistor of the present invention subjected to tensile stress applied to its channel region.

Further, as the gate electrodes 14 and 24 remain covered with the silicon oxide film 90 during thermal processing to be performed in the subsequent step, variation in resistance value of the polysilicon gate electrodes can be controlled in the non-silicided region.

While the invention has been shown and described in detail, the foregoing description is in all aspects illustrative and not restrictive. It is therefore understood that numerous modifications and variations can be devised without departing from the scope of the invention.

The invention claimed is:

1. A method of manufacturing a semiconductor device including a first region of a semiconductor substrate and a second region of the semiconductor substrate, comprising:
   (a) forming a first gate insulating film of a first NMOS transistor over the first region;
   (b) forming a second gate insulating film of a second NMOS transistor over the second region;
   (c) after the steps (a) and (b), forming a first gate electrode of the first NMOS transistor over the first gate insulating film;
   (d) after the steps (a) and (b), forming a second gate electrode of the second NMOS transistor over the second gate insulating film;
   (e) after the steps (c) and (d), implanting ions into the first and second gate electrodes in order to be amorphous, respectively;
   (f) after the step (e), forming an insulating film in order to cover the first and second gate electrodes;
   (g) after the step (f), removing the insulating film formed over the second gate electrode in order to keep the insulating film formed over the first gate electrode;
   (h) after the step (g), performing thermal processing in order to crystallize the first and second gate electrodes; and
   (i) after the step (h), removing the insulating film formed over the first gate electrode,
   wherein, after the step (i), a tensile stress is applied in a first channel region of the first NMOS transistor under the first gate electrode, and
   wherein a drain current of the first NMOS transistor is increased by the tensile stress.

2. A method of manufacturing a semiconductor device according to the claim 1,
   wherein the first NMOS transistor is used for a logic circuit, and
   wherein the second NMOS transistor is used for a SRAM or a DRAM.

3. A method of manufacturing a semiconductor device according to the claim 1,
   wherein the first and second gate electrodes are formed of a silicon film, respectively.

4. A method of manufacturing a semiconductor device according to the claim 1,
   wherein the ions include arsenic.

5. A method of manufacturing a semiconductor device according to the claim 1,
   wherein the ions include germanium.

6. A method of manufacturing a semiconductor device including a first region of a semiconductor substrate and a second region of the semiconductor substrate, comprising:
   (a) forming a first gate insulating film of a first NMOS transistor over the first region;
   (b) forming a second gate insulating film of a second NMOS transistor over the second region;
   (c) after the steps (a) and (b), forming a first gate electrode of the first NMOS transistor over the first gate insulating film;
   (d) after the steps (a) and (b), forming a second gate electrode of the second NMOS transistor over the second gate insulating film;
   (e) after the steps (c) and (d), implanting first ions in the first and second regions:
   (f) after the step (e), forming sidewalls over side surfaces of the first gate electrode and side surfaces of the second gate electrode;
   (g) after the step (f), implanting second ions into the first gate electrode, the first region, the second gate electrode and the second region, thereby the first and second gate electrodes become amorphous, respectively;
   (h) after the step (g), forming an insulating film in order to cover the first and second gate electrodes;
   (i) after the step (h), removing the insulating film formed over the second gate electrode in order to keep the insulating film formed over the first gate electrode;
   (j) after the step (i), performing thermal processing in order to crystallize the first and second gate electrodes; and
   (k) after the step (j), removing the insulating film,
   wherein, after the step (k), a tensile stress is applied in a first channel region of the first NMOS transistor under the first gate electrode, and
   wherein a drain current of the first NMOS transistor is improved by the tensile stress.

7. A method of manufacturing a semiconductor device according to the claim 6,
 wherein the first NMOS transistor is used for a logic circuit, and
 wherein the second NMOS transistor is used for a SRAM or a DRAM.

8. A method of manufacturing a semiconductor device according to the claim 6,
 wherein the first and second gate electrodes are formed of a silicon film, respectively.

9. A method of manufacturing a semiconductor device according to the claim 6,
 wherein the second ions include arsenic.

10. A method of manufacturing a semiconductor device according to the claim 6,
 wherein the second ions include germanium.

* * * * *